(12) United States Patent
Nuetzel

(10) Patent No.: US 6,913,990 B2
(45) Date of Patent: Jul. 5, 2005

(54) METHOD OF FORMING ISOLATION DUMMY FILL STRUCTURES

(75) Inventor: Joachim Nuetzel, Kulmbach (DE)

(73) Assignee: Infineon Technologies AG, Munich (DE)

(*) Notice: Subject to any disclaimer, the term of this patent is extended or adjusted under 35 U.S.C. 154(b) by 10 days.

(21) Appl. No.: 10/628,149

(22) Filed: Jul. 28, 2003

(65) Prior Publication Data

US 2005/0026341 A1 Feb. 3, 2005

(51) Int. Cl.$^7$ .................................. H01L 21/4763
(52) U.S. Cl. ................. 438/622; 438/737; 438/738; 438/744
(58) Field of Search .................. 438/622, 634–638; 257/758–760

(56) References Cited

U.S. PATENT DOCUMENTS 6,717,267 B1 * 4/2004 Kunikiyo .................. 257/758

* cited by examiner

*Primary Examiner*—Dung A. Le
(74) *Attorney, Agent, or Firm*—Slater & Matsil, L.L.P.

(57) ABSTRACT

A method of providing dummy fill structures to meet the strict requirements for planarizing MRAM (Magnetic Random Access Memory) and other semiconductor devices to gain silicon floor space and allow maximum use of wiring levels. The method deposits a sacrificial or dummy layer of dielectric material such as $SiO_2$ to form dummy fill structures prior to the planarization steps. The insulative dummy fill structures allow the use of less precise lithography and etching methods. The dummy fill structures provide support during the CMP process that planarizes the active devices prior to depositing another layer of $SiO_2$ and etching lines of metallization. Since the dummy structures are made of a dielectric rather than conductive materials, the risk of shorts between levels of metallization and between active devices and lines of metallization is reduced.

17 Claims, 7 Drawing Sheets

METHOD OF FORMING ISOLATION DUMMY FILL STRUCTURES

TECHNICAL FIELD

The present invention relates generally to a method of providing insulating dummy fill structures, and more particularly to the use of such dummy fill structures to meet the stringent pattern factor rules for fill structures during the steps of manufacturing electronic devices such as the step of planarization of circuits with magnetic TJ's (Tunnel Junctions) to avoid shorting of active TJ devices and especially between the metallizations lines above and below the TJ devices.

BACKGROUND

As is well known by those skilled in the art, a continuing goal in manufacturing and production of semiconductors is a reduction in size of components and circuits with the concurrent result of an increase in the number of circuits and/or circuit elements on a single semiconductor device. This relentless and successful reduction in size of the circuit elements has also required reduction in the size of the conductive lines connecting devices and circuits. However, as the conducting lines are designed to be smaller and smaller, the resistance of the interconnects increases. Further, as the number of dielectric layers increases, the capacitive coupling between lines on the same level and adjacent level increases.

In the past, aluminum was used as the metal interconnect lines and silicon oxide as the dielectric. However, newer manufacturing techniques now favor copper as the metal for interconnect lines and various low K materials (organic and inorganic) are favored as the dielectric material. Not surprisingly, these material changes have required changes in the processing methods. In particular, because of the difficulty of etching copper without also causing unacceptable damage to the dielectric material, the technique of forming the metal interconnect lines has experienced significant changes. Namely, whereas aluminum interconnects could be formed by depositing a layer of aluminum and then using photoresist, lithography, and etching to leave a desired pattern of aluminum lines, the formation of copper interconnect lines are typically formed by a process now commonly referred to as a Damascene process. The Damascene process is almost the reverse of etching, and simply stated a trench, canal or via is cut, etched or otherwise formed in the underlying dielectric and is then filled with metal (i.e., copper). The metal deposited outside the trenches and vias is then polished away.

The process is rather straightforward if lines of metallization or copper layer were to be formed at only one level. However, as is well known by those skilled in the art, semiconductor devices are now formed at multiple levels on a chip and consequently metallization or interconnects, which are on the order of 100 nm (nanometers) and less, must also be formed at each level. Further, not only are multiple levels of metallization required, but these multiple levels must be interconnected. The difficulty in connecting vias through the dielectric (which will then be filled with copper) that will align with a 100 nm interconnect line at another level in the same semiconductor device is obvious.

However, for the manufacture of some semiconductor devices such as TJ (Tunnel Junctions) elements, there are still other problems that must be solved. For example, the planarization in open areas adjacent densely packed TJ elements often result in significant "dishing" problems. More specifically, TJ planarization required during the manufacture of MRAM (Magnetic Random Access Memory) elements poses special difficulties, since the height of these densely packed TJ elements is substantially less than a typical via height. Therefore the resulting structures are more prone to interlevel shorts than a normal dual damascence metal level and require stringent pattern factor rules if the fill structures are made of the same kind of magnetic elements used for the active TJ elements. These stringent rules have been found to be necessary to avoid active TJ's being shorted by lines of metallization, and also to avoid shorts between the metal lines above and below the TJ's. These fill structures provide an unreliable electrical path between both metal levels and have to be carefully placed to avoid unwanted electrical connections. Therefore, although the stringent form factor rules solve the problem of shorting active TJ's, the use of these rules puts severe limits on the design of wiring levels and often results in ineffective wiring and wasted silicon "floor space."

SUMMARY OF THE INVENTION

These and other problems are generally solved or circumvented, and technical advantages are generally achieved, by the present invention that provides a method of planarizing a layer containing active devices in a semiconductor structure. The method comprises the steps of providing a semiconductor structure that has one or more layers of embedded metal wiring. The magnetic layer structure is formed on top of this structure by depositing the magnetic layers and reactive ion etching the films employing one or more layers of metal and insulators as a hardmask. On top of these magnetic layer structures, a first thin dielectric layer, such as for example only, silicon nitride, silicon carbide or aluminum oxide compositions, is deposited. The thin dielectric layer of a material such as SiN or SiC will typically promote adhesion and inhibit the diffusion of Cu and the other metallic elements used. Further, according to this invention the first dielectric layer is etch selective with respect to the second deposited dielectric layer, which should have the same thickness as the height of the magnetic elements. This second dielectric layer can then be loosely patterned without concern for mask accuracy. Further, the mask does not need precise alignment with respect to the previous lithographic levels and can therefore be accomplished much cheaper. Etching this second dielectric layer down to the first dielectric layer provides a non-conducting dummy fill needed to fulfil the pattern factor rules for the insulator planarization after the deposition of the third insulating layer or layer stack. The second layer of dielectric material is etched so that it leaves portions of material or dummy structures having a height equivalent to the height of the active semiconductor devices on the top surface of the first layer of dielectric material. A third layer of dielectric material having a thickness greater than the height of the active semiconductor devices is deposited over the active semiconductor devices and dummy structures and then planarized.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
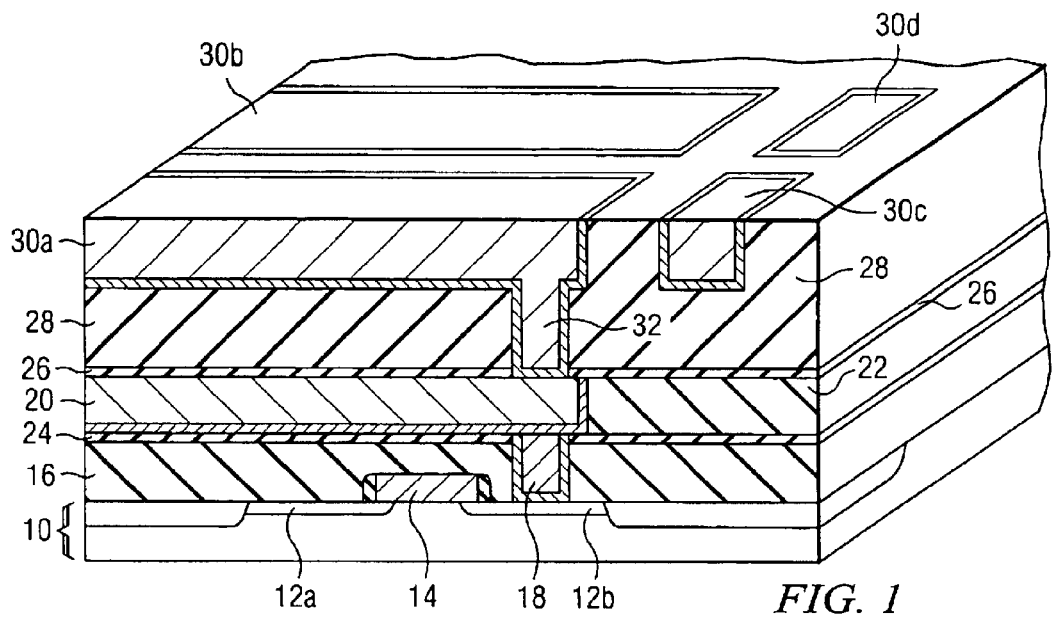
FIG. 1 illustrates a right angle cross-sectional view of a typical prior art semiconductor structure having intermediate levels that include lines of metallization and vias as well as semiconductor devices.

Referring now to FIG. 1, there is shown a semiconductor structure comprised of layers of active elements such as FET's (Field Effect Transistors) and layers of metallization. As shown, there is a first layer 10 having source/drain areas of the FET identified as 12a and 12b with a gate structure 14. A layer of silicon oxide or dielectric material 16 covers layer 10 and gate structure 14. There is included a conductive via 18 connecting the source/drain area 12b to a first layer of metallization such as copper line 20 located in a second layer of the dielectric material 22. In the embodiment shown, there is also shown a layer of silicon nitride 24 separating the two dielectric layers 16 and 22 as is usual to provide an etch stop layer while etching the trenches for the copper or metallization line 20. Another silicon nitride layer 26 covers the lines of metallization 20 and the surrounding dielectric material 22. This is followed by another dielectric layer such as silicon oxide layer ($SiO_2$) 28, which covers silicon nitride layer 26. It should be appreciate at this point, that layer 10 with the semiconductor active elements such as Field Effect Transistors having source/drain areas 12a and 12b and the gate 14 may also include its own lines of metallization (not shown) such as included in silicon oxide layer 22. Also as shown, in the layer 28 of dielectric material, there are lines and areas of metallization (M2) having reference numbers 30a, 30b, 30c and 30d. Typically there will also be one or more vias such as via 32, connecting the lines of metallization 30a and 30b deposited in the layer of silicon oxide $SiO_2$ and extending to the first line of metallization 20 deposited in dielectric layer 22.

Thus, to this point there is shown a semiconductor structure having several layers of metallization and active semiconductor elements. It will be appreciated that the discussed semiconductor structure of FIG. 1 is provided as an example only and, for purposes of this invention, there may be even more or less layers of other semiconductor structures. In any event, as shown in FIG. 1 the areas of metallization 30a, 30b, 30c and 30d and the dielectric material or silicon oxide 28 has been CMP or Chemical Mechanical Polished such that it is now suitable for processing or depositing of further semiconductor elements.

Figure 2A:
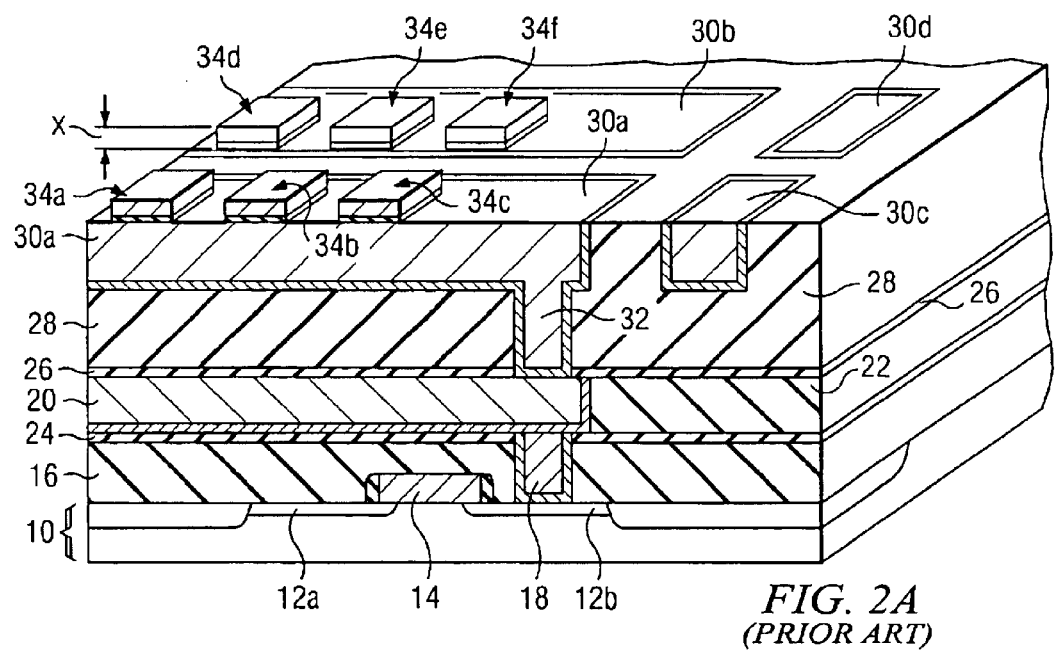
FIG. 2A illustrates the right angle cross-sectional view of FIG. 1 with semiconductor devices such as TJ's (Tunnel Junctions) deposited over the lines of metallization and the surrounding dielectric.

Referring now to FIG. 2A, there is shown the structure of FIG. 1 wherein TMR elements 34a, 34b, 34c, 34d, 34e and 34f such as for example Tunnel Junctions (TJ's) having a known height have been deposited directly over the metallization or wire levels 30a and 30b. That is, in an XPC (cross point memory cell) architecture, the TMR elements are deposited directly on top of the switch and read wire. For FET architecture (not shown), however, a thin insulation layer is first provided over the metallization (switch wire) before the TMR elements are deposited. The TMR elements are then deposited and connected to the read wire by a local interconnect. However, in the embodiment shown in the example and for purposes of explanation only, it is assumed the circuitry does not require and is not suitable for an active TJ element over the metallization of 30c and 30d.

However, as is well known by those skilled in the art, planarization for TJ's and MRAM structures (Magnetic Random Access Memory) require very stringent pattern factor rules for fill structures to avoid dishing which typically may result in shorting of one or more active TJ's or shorts between the wiring levels above and below, especially in those chip areas without TJ arrays. These stringent pattern factor rules put severe limits on the design freedom of these structures often resulting in poorly used wiring levels and available silicon.

Figure 2B:
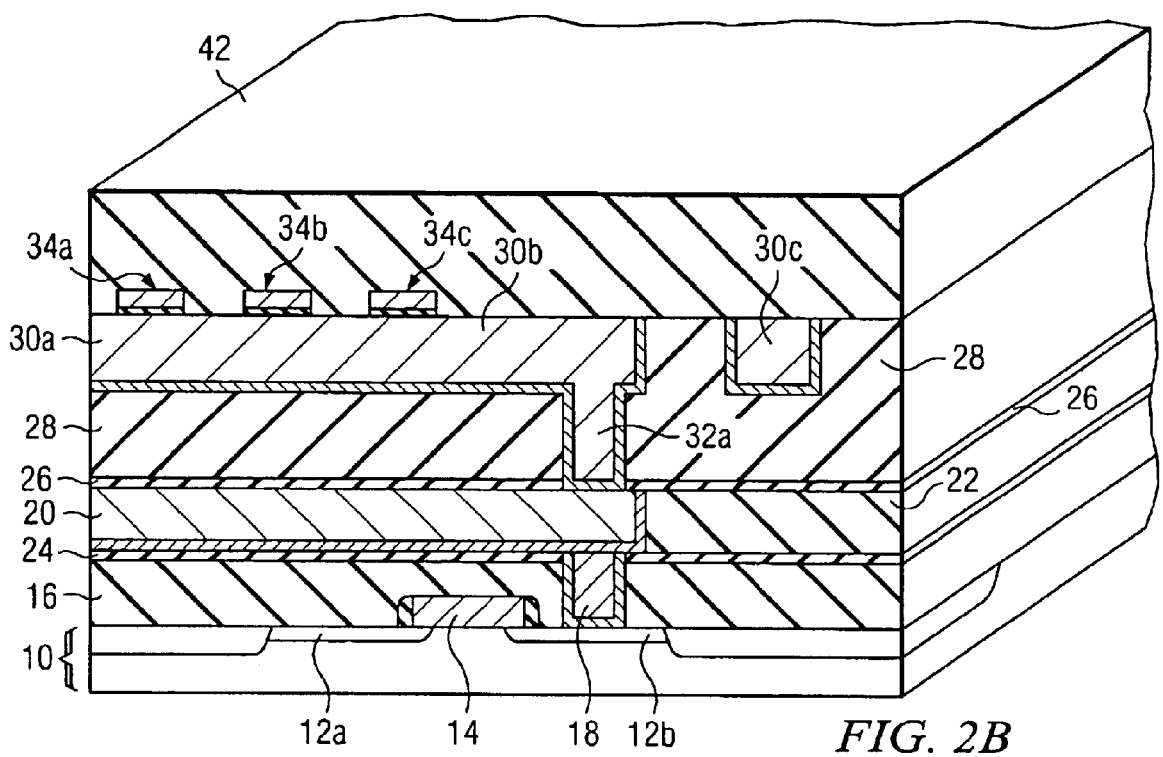
FIG. 2B shows the prior art structure of FIG. 2A with a layer of dielectric, such as for example, $SiO_2$ prior to CMP (Chemical Mechanical Polishing)
Figure 2C:
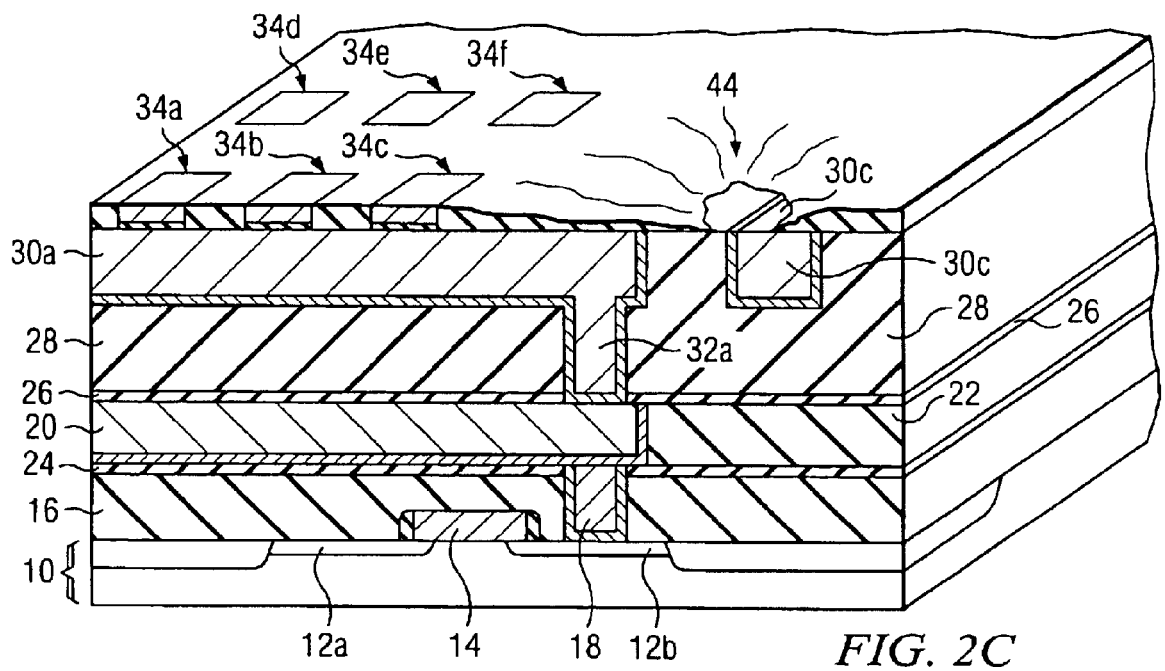
FIG. 2C shows the prior art structure of FIG. 2B after Chemical Mechanical Polishing to planarize the Tunnel Junctions, and how dishing of the surrounding dielectric can occur in areas not populated with TJ's or dummy fill structures.

For example, referring to FIGS. 2B and 2C, the problem of excessive "dishing" is illustrated when the stringent pattern factor rules are not followed. As shown, a typical dielectric layer 42 of material such as $SiO_2$ or $Si_3N_4$, etc. is deposited over the semiconductor structure of FIG. 2A to a depth of about 150 nm. However, as will be seen from FIG. 2A, although densely packed TJ structures 34a, 34b, 34c, 34d, 34e and 34f having a known height are available to act as a stop limit to the CMP, there is an unpopulated area to the right of the TJ's 34c and 34f. This "unpopulated" area is very vulnerable to over-polishing or dishing of the dielectric during the Chemical Mechanical Polishing process. As shown in FIG. 2C, the large area of dielectric layer 42 on the right side of the TJ element 34c has been over-polished so as to form a dished out area 44 where all of the dielectric material 42 has been removed such that a portion of the area of metallization 30c is exposed. As will be appreciated by those skilled in the art, since the deposition of any material over dielectric 42, including conductive materials, will be in contact with the area of metallization 30c, further processing of the structure may very likely be defective such that the structure must be scrapped.

Figure 3A:
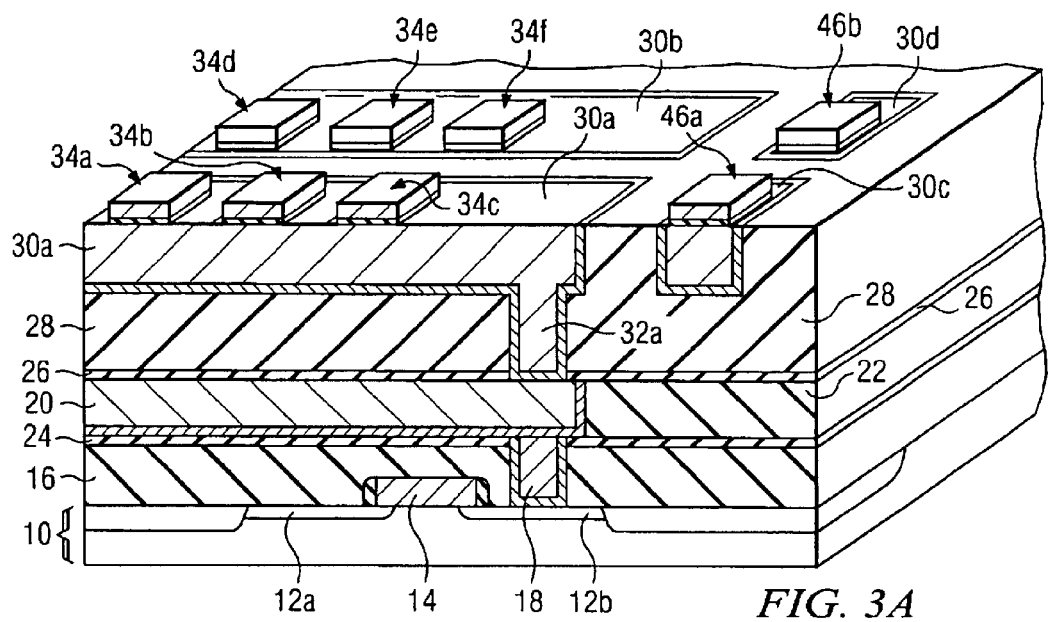
FIG. 3A illustrates the prior art process of using non-active TJ's as dummy fill to avoid over polishing (CMP) or dishing.
Figure 3B:
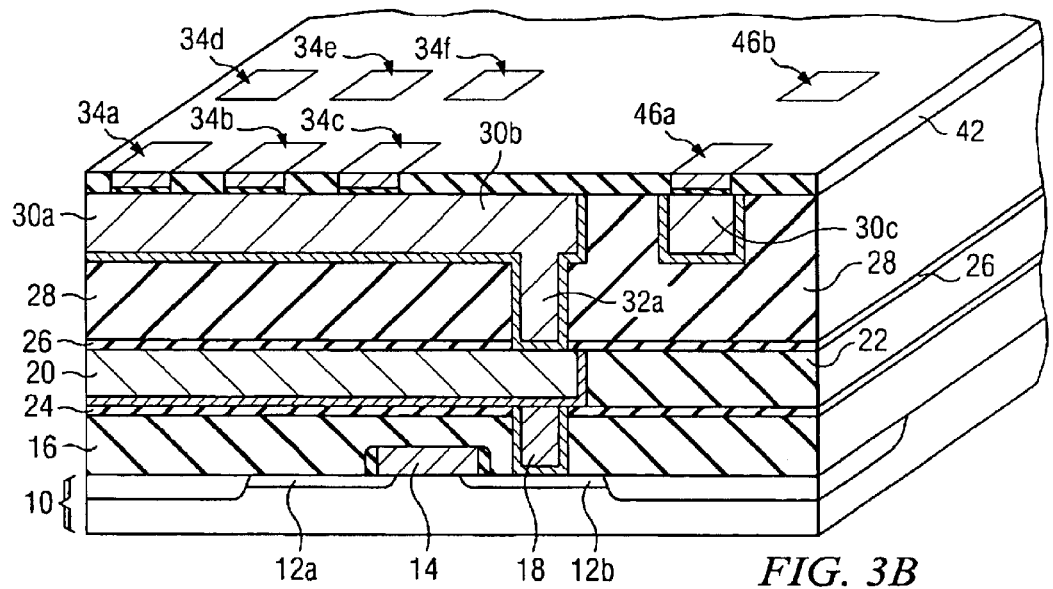
FIG. 3B illustrates the further prior art processing for planarizing the active or functional TJ's of FIG. 3A.

Therefore, according to the prior art, TJ elements were often deposited over metallization or other unpopulated areas but would not be connected or activated and were referred to as "dummy" TJ elements. These dummy TJ elements are formed at the same time the active TJ elements are formed and, therefore, also have the same known height of the active TJ elements 34a through 34f. Therefore, as an example, dummy elements 46a and 46b shown in FIG. 3A, would be deposited for purposes of meeting the stringent pattern factor rules. Thus, the large surface areas of metallization and dielectric 28 that were "unpopulated" with semiconductor devices in FIG. 2A, now include the dummy elements 46a and 46b. Then, according to one example of the prior art, a silicon nitride layer 42 was deposited over the active TJ elements 34a, 34b, 34c, 34d, 34e and 34f as well as the dummy or non-active TJ elements 46a and 46b. The silicon nitride deposition layer 42 was then Chemically Mechanically Polished to provide a flat level surface for further processing as shown in FIG. 3B. However, unlike the example of FIG. 2C, the dummy or non active TJ's 46a and 46b help to prevent the dishing above the areas of metallization 30c and 30b.

Figure 3C:
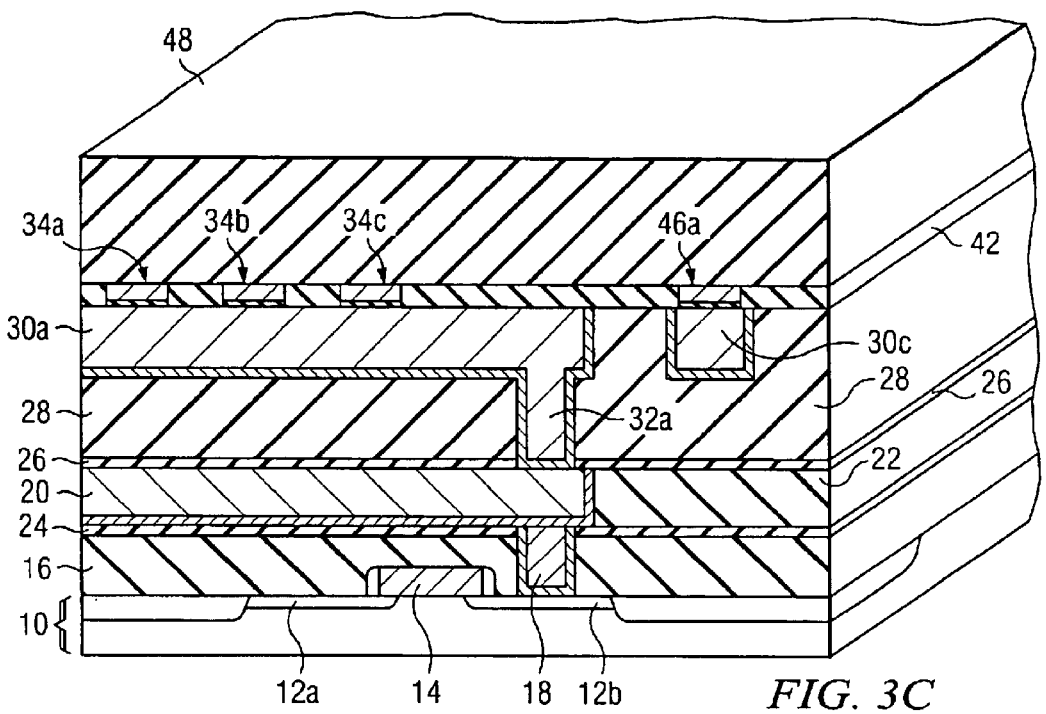
FIGS. 3C through 3F illustrate the still further process for adding another level of metallization to the structure of FIG. 3B.
Figure 3D:
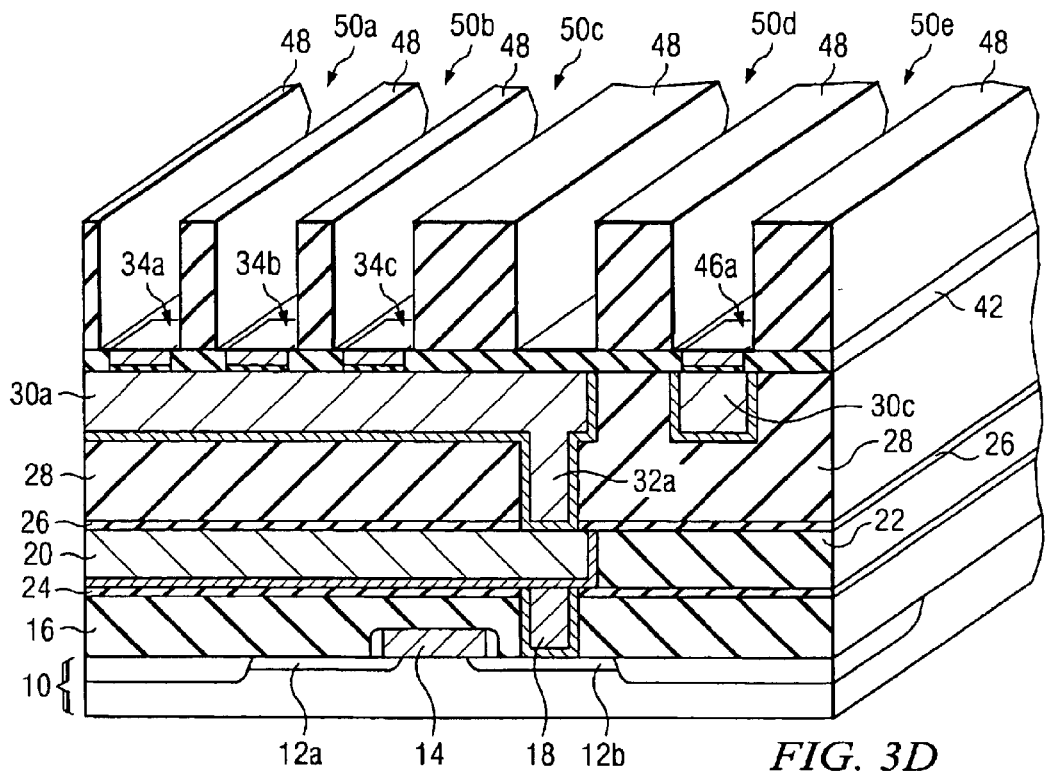
Figure 3E:
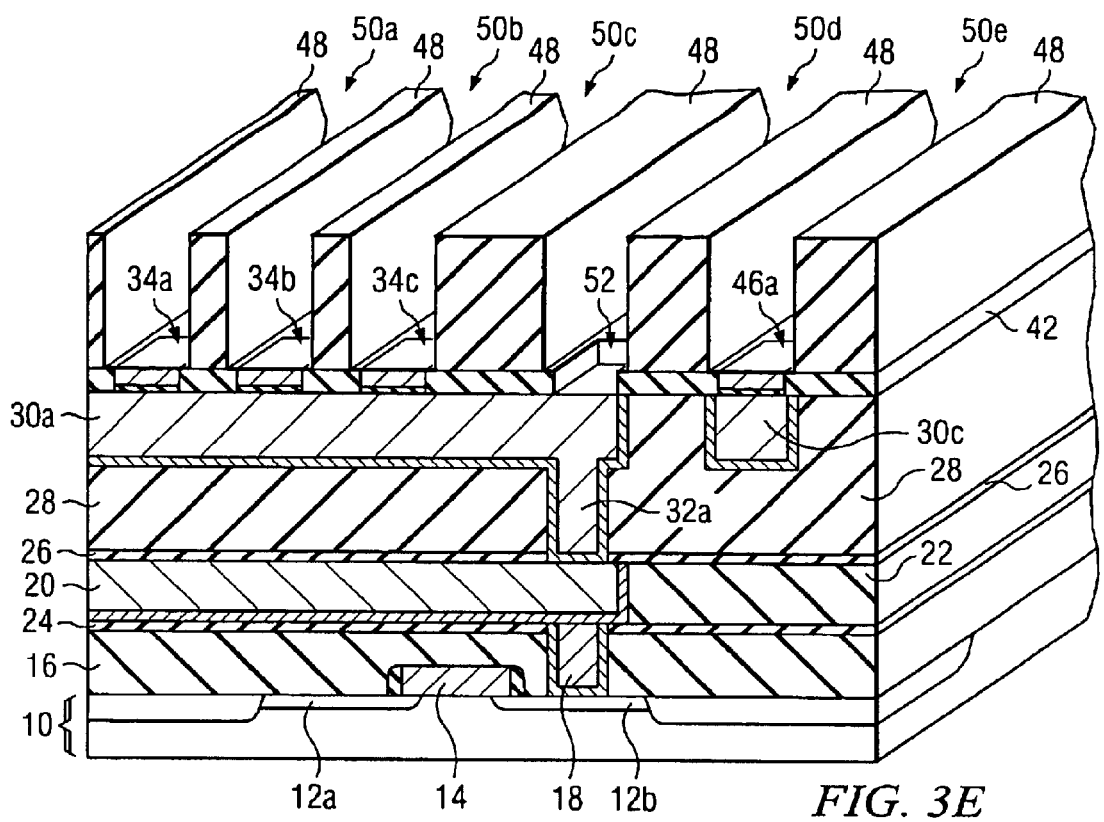

Referring to FIG. 3C, the Chemically Mechanical Polished layer 42 was typically then covered by another dielectric layer stack 48 to a depth of about 400 mm which was then pattern etched by standard DUV (deep ultraviolet) lithographic patterning followed by reactive ion etching. It will be appreciated that dielectric layer stack 48 may be selected from substantially any suitable material (combinations) used in the manufacture of semiconductor devices including $SiO_2$, low K materials and the like. Especially starting with a thin layer of e.g. SiN, with lower etch rates compared to the main dielectric layer, provides an "etch stop" and therefore enhanced process control. Thus, FIG. 3D illustrates trenches 50a through 50e that will be used for the third level of metallization. However, as shown in FIG. 3D, the trench etching is stopped at the top surface of the TMR elements including the dummy TMR elements 46a and 46b, such that the M2 metallization 30c is not exposed. The top of dummy elements 46a and 46b are visible in FIG. 3D. The trench etching illustrated in FIG. 3D is then typically followed by further via lithography and etching through the silicon nitride layer 42 as indicated in FIG. 3E by via or area 52 in trench 50d. Therefore, when the trenches, including trench 50d, and via 52 are filled with copper, a connection will be made with the wiring of M2 metallization 30a as shown in FIG. 3F.

Figure 3F:
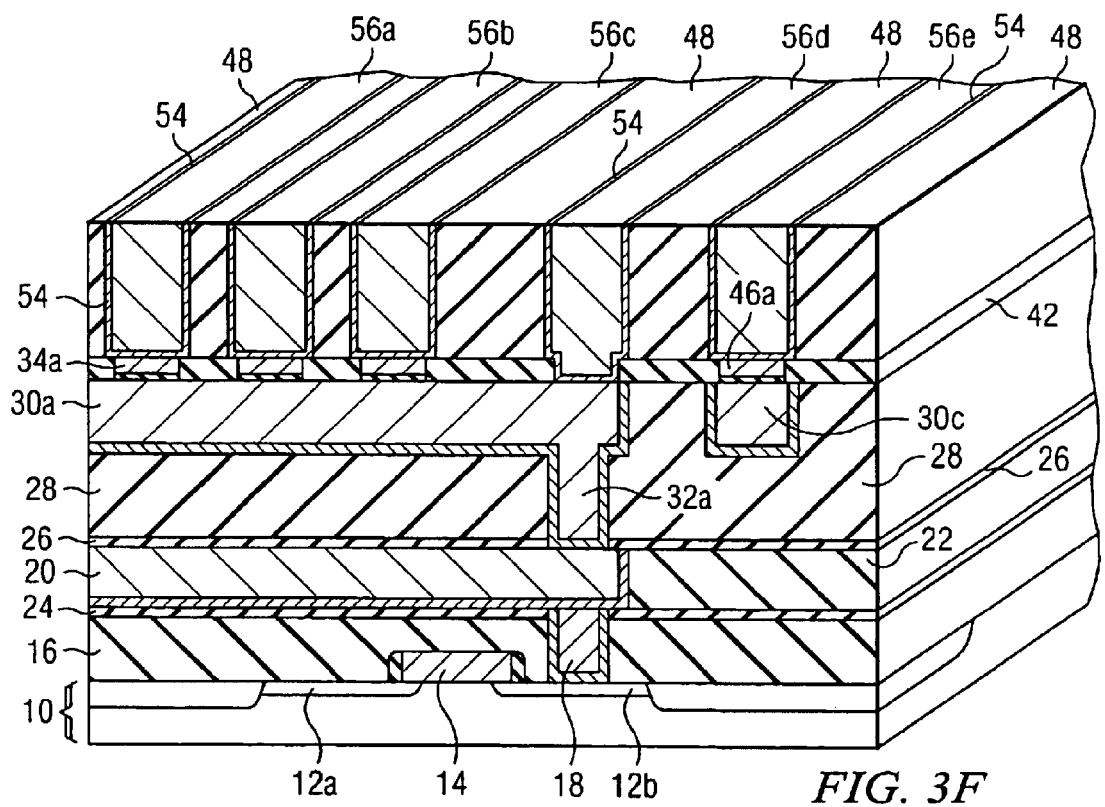

Also, as shown in FIG. 3F, there is typically deposited a tantalum/tantalum nitride liner 54 in the etched 50a through 50e trenches and the etched via 52, which is then followed by the deposition of copper 56a through 56e. The copper deposition is, in turn, followed by Chemical Mechanical Polishing. However, as was mentioned earlier, the prior art process discussed above was typically wasteful of silicon floor space because of the stringent fill factor rules followed while using dummy TJ elements to avoid shorts of the active TJ elements.

Therefore, referring again to FIG. 2A, there is shown the active TMR elements or TJ stacks 34a, 34b, 34c, 34d, 34e and 34f having a "known" height and positioned over the metallization 30a and 30b. However, as discussed above, there are no active or inactive TJ elements over the metallization areas 30c and 30d to the right of TJ elements 34c and 34f.

Figure 4A:
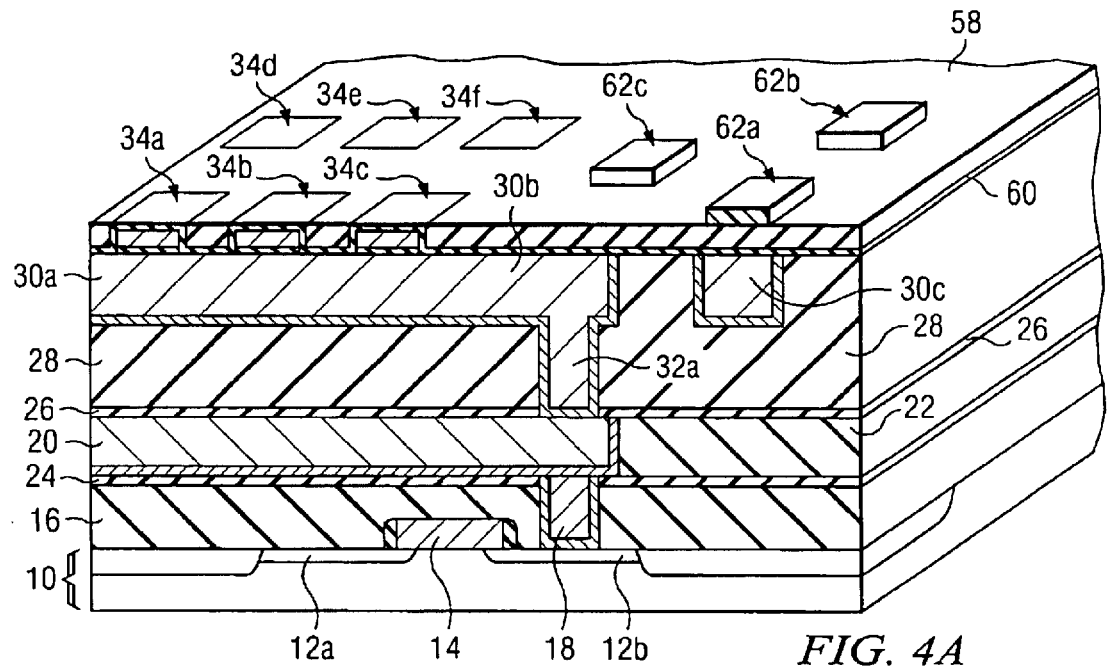
FIGS. 4A through 4D illustrate the process of using dummy fill and planarization of Tunnel Junction's according to the teachings of the present invention.

Therefore, according to the present invention and as shown in FIG. 4A, a dielectric material such as silicon oxide "dummy" layer 58 is formed over TJ's 34a, 34b, 34c, 34d, 34e and 34f to a height 3 equal to the "known" height of the active TJ's 34a through 34f as was discussed above. Also as shown in FIG. 4A, before depositing the dielectric layer 58, a silicon nitride layer 60 may be deposited over the TJ's 34a through 34f as well as the remaining and uncovered metallization and silicon oxide such as shown in FIG. 4A to act as an etch stop layer.

Figure 4B:
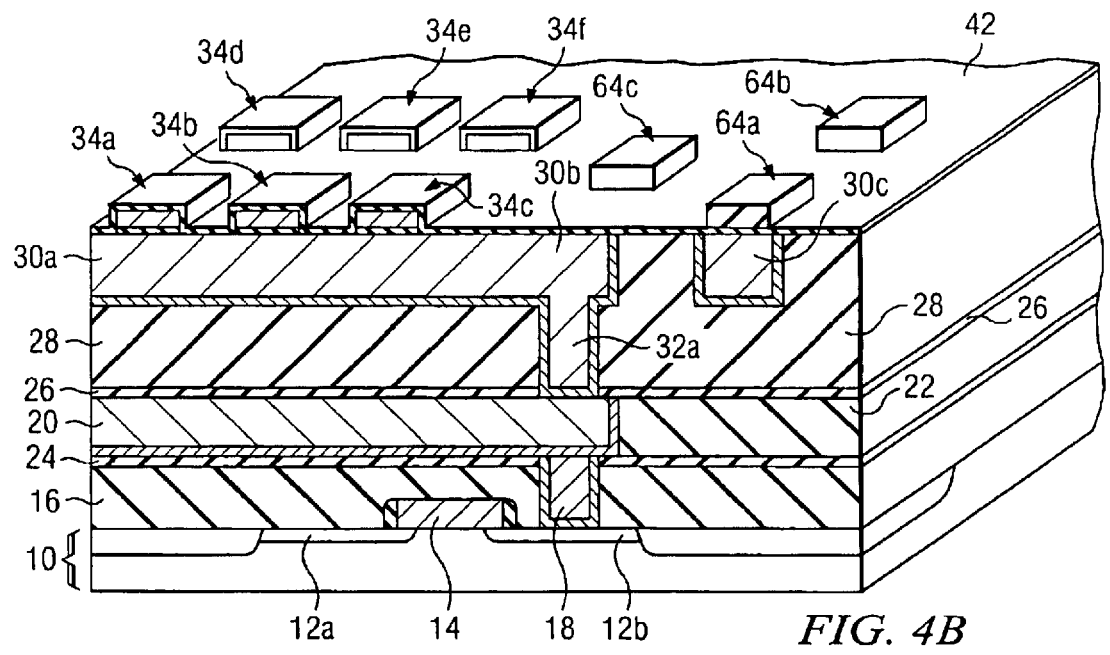

As stated, the dielectric layer 58 is a dummy fill oxide and will be used to make dummy structures. Therefore, referring again to FIG. 4A, a photoresist mask comprising portions 62a and 62b is patterned over the "unpopulated" areas such that after etching, dummy fill structures will remain in the "unpopulated" areas to help prevent dishing during subsequent Chemical Mechanical Polishing. However, it is important to note that since the active TJ's 34a through 34f have already been deposited in their precise locations, it will be appreciated that the patterned photoresist 62a and 62b, and consequently the photoresist mask used for etching the dummy fill dielectric or silicon oxide layer 58 need not be concerned with the precise mask accuracy required to meet the stringent alignment required by the fill pattern rules for depositing the TJ's. Therefore, less expensive lithography techniques such as MUV (Mid-UltraViolet) rather than the DUV (Deep UltraViolet) lithography may be used. Further, economical etching techniques including robust etching of the dielectric with a material that is highly selective to the stop etch silicon nitride or silicon carbide layer 60 may be used for etching the dummy fill structures such as dummy fill structures 64a and 64b as shown in FIG. 4B. It is important to understand, however, that the height of dummy structures 64a and 64b is required to be substantially the same as the height of the active TJ's 34a through 34f. But the size and the placement against the wiring above and below, can be freely selected. Thus, unlike the dummy structures discussed with respect to the prior art methods of FIGS. 3A and 3B, there is shown an additional photoresist mask portion 62C (FIG. 4A) and an additional dummy structure 64c (FIG. 4B) that was not possible in the prior art.

According to one embodiment of the invention, once the photoresist has been patterned with the areas 62a and 62b, the dielectric layer 58 will be etched with a chemical very selective to $Si_3N_4$ (silicon nitride), such that when the etching process reaches the $Si_3N_4$ layer 60, the etch will be stopped. Thus, portions of the layer of the $SiO_2$ 58 will remain over the "unpopulated" areas that have a height or thickness equal to the height of the active TJ elements. The remaining photoresist mask portions are then stripped and the remaining dummy structures formed of dielectric layer 58 are CMP so as to leave the structure of FIG. 4B.

Figure 4C:
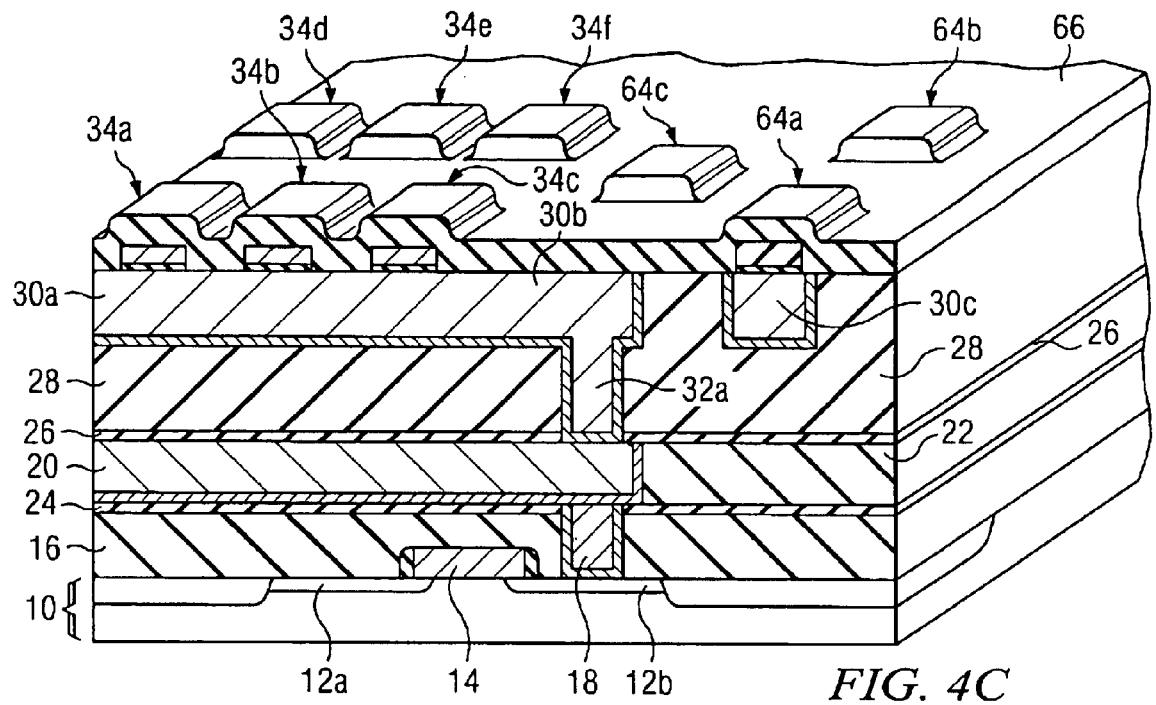
Figure 4D:
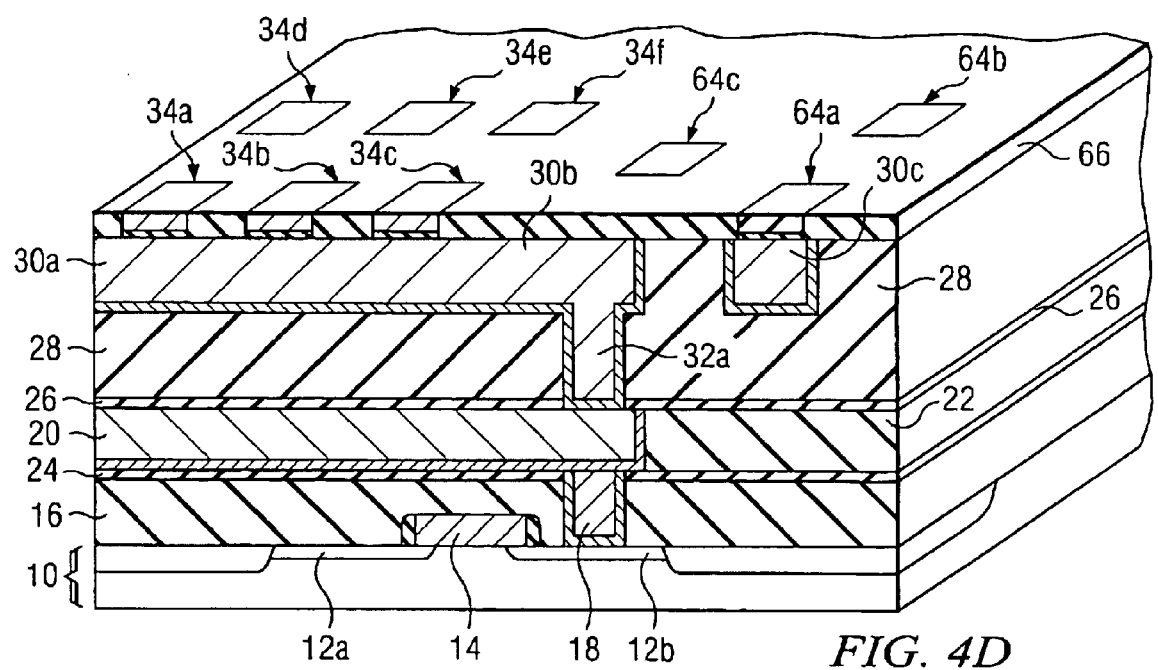

Referring now to FIG. 4C and according to one embodiment of the present invention, the active TJ's 34a, 34b, 34c, 34d, 34e and 34f as well as the dummy fill silicon oxide structures 64a and 64b and the supporting metallization and silicon oxide are covered by a dielectric layer 66 that is resistant to copper diffusion. As is well known, a silicon nitride ($Si_3N_4$) layer having thickness of about 150 mm is particularly suitable for this purpose. Other suitable dielectric materials include Silicon oxy Nitride (SiON), Silicon Carbide (SiC) and Aluminum Oxide ($Al_2O_3$). The layer 66 of silicon nitride or other dielectric is then also Chemical Mechanical Polished to the top surface of the TJ structures 34a through 34f and the dummy structures 64a, 64b, and 64c as shown in FIG. 4D. The polished layer of silicon nitride or other dielectric material used to prevent diffusion of the copper is then covered by another dielectric layer 48 such as silicon oxide to a deposition of about 400 nm in the same manner as was discussed above with respect to FIG. 3C. Then, as was discussed with respect to FIGS. 3D through 3F, the silicon oxide layer 48 is first etched to form the trenches 50a through 50e. The trench etching is followed by patterning and etching of the via 52. A tantalum nitride liner 52 and copper are then deposited to form the wires or lines of metallization 56a through 56e followed by Chemical Mechanical Polishing of the copper to allow for still another layer of electronic elements and/or metallization. Thus, another difference in a structure manufactured according to the present invention compared to FIGS. 3F and 3G is that the lines of metallization are separated by the dummy fill dielectric structures 64a and 64b and therefore, there is little danger of a short between the metallization level 26.

Although the present invention and its advantages have been described in detail, it should be understood that various changes, substitutions and alterations can be made herein without departing from the spirit and scope of the invention as defined by the appended claims. For example, it will be readily understood by those skilled in the art that dimensions and layer thickness may be varied while remaining within the scope of the present invention.

Moreover, the scope of the present application is not intended to be limited to the particular embodiments of the process, methods and steps described in the specification. As one of ordinary skill in the art will readily appreciate from the disclosure of the present invention, processes, methods, or steps, presently existing or later to be developed, that perform substantially the same function or achieve substantially the same result as the corresponding embodiments described herein may be utilized according to the present invention. Accordingly, the appended claims are intended to include within their scope such processes, methods, or steps.

What is claimed is:

1. A method of planarizing active layers of devices on a semiconductor structure comprising the steps of:
   providing a semiconductor structure, said semiconductor structure having a top layer of dielectric material and areas of metallization defined in the top surface of said top layer of dielectric material;
   depositing tunneling magneto-resistance "TMR" devices at selected locations over said areas of metallization, said TMR devices having a known height above said top surface of said top layer of dielectric material;
   depositing a first dielectric layer over said top surface of said top layer of dielectric material and over said TMR devices;
   forming a dummy layer of dielectric material over said first dielectric layer to a thickness equal to said known height of said TMR devices;
   forming a dummy structure pattern mask over said dummy layer of dielectric material;
   etching said dummy layer of dielectric material selective to said first dielectric layer so as to leave portions of said dummy layer as dummy structures on said top surface of said top layer of dielectric material, said dummy structures having a height equivalent to said known height; and
   depositing another layer of dielectric material over said TMR devices and said dummy structures, said another layer of dielectric material having a thickness at least greater than said known height of said TMR devices.

2. The method of claim 1 wherein the semiconductor structure is according to an XPC (cross point memory cell) architecture, and the TMR devices are deposited directly on top of the metallization.

3. The method of claim 1 wherein the semiconductor structure is according to an FET architecture, the metallization is covered by a thin insulation layer, the TMR devices are deposited on top of said thin insulation layer and are connected by a local interconnect to an adjacent read wire.

4. The method of claim 1 wherein said TMR devices comprise at least two layers of metallization.

5. The method of claim 1 wherein said first dielectric layer is resistant to the diffusion of copper atoms and ions.

6. The method of claim 1 wherein said step of depositing a first dielectric layer comprises the step of depositing a layer selected from the group consisting of silicon nitride ($Si_3N_4$), silicon oxy nitride (SiON), silicon carbide (SiC) and aluminum oxide ($Al_2O_3$).

7. The method of claim 1 wherein said step of depositing another layer of dielectric material comprises the step of depositing a layer of silicon oxide ($SiO_2$).

8. The method of claim 7 further comprising the steps of:
   etching wire trenches in said silicon oxide layer down to said; first dielectric layer;
   further etching vias through said first dielectric layer in selective ones of said trenches to said areas of metallization in said top layer of dielectric material; and
   filling said trenches and vias with a conductive metal.

9. The method of claim 8 wherein said steps of etching trenches and vias comprise forming an etch mask with lithography and reactive ion etching said silicon oxide layer.

10. The method of claim 8 wherein said conductive metal is copper.

11. The method of claim 8 further comprising the step of depositing a coating of TaN (tantalum nitride) over said trenches and said vias.

12. The method of claim 1 wherein said step of depositing another layer of dielectric material comprises the step of depositing a layer of a low K dielectric.

13. The method of claim 1 wherein said step of etching said dummy layer of dielectric material comprises the step of patterning a hardmask with MUV (mid-ultraviolet) lithography and etching said dummy layer of dielectric material with an oxide etch selective to silicon nitride.

14. The method of claim 1 wherein active layers of devices include Tunnel Junction devices.

15. The method of claim 1 wherein said step of etching said dummy layer of dielectric material comprises the steps of depositing said dummy layer of dielectric material to a thickness equivalent to said known height, and etching to remove all of said dummy layer of dielectric material except those portions protected by a photoresist mask.

16. The method of claim 1 wherein said step of depositing TMR devices is according to pattern factor rules for fill structures and said step of etching said dummy layer of dielectric material follows less stringent rules and uses MUV (Mid-UltraViolet) lithography.

17. The method of claim 1 wherein said step of etching said dummy layer of dielectric material comprises the steps of forming said dummy layer of dielectric material to a thickness substantially equal to said known height, etchings aid dummy layer with a process selective to said first dielectric layer and stripping a photoresist mask to leave said dummy structures.

* * * * *

UNITED STATES PATENT AND TRADEMARK OFFICE
CERTIFICATE OF CORRECTION

PATENT NO.    : 6,913,990 B2
DATED         : July 5, 2005
INVENTOR(S)   : Nuetzel It is certified that error appears in the above-identified patent and that said Letters Patent is hereby corrected as shown below:

Column 8,
Line 24, delete "said; first" and insert -- said first --.
Line 45, delete "wherein active" and insert -- wherein said active --.
Line 61, delete "etchings" and insert -- etching --.
Line 62, delete "aid" and insert -- said --.

Signed and Sealed this

Eighth Day of November, 2005

JON W. DUDAS
*Director of the United States Patent and Trademark Office*